(12) United States Patent
Inoue et al.

(10) Patent No.: US 9,909,722 B2
(45) Date of Patent: Mar. 6, 2018

(54) FLUORESCENCE-EMITTING LIGHT SOURCE UNIT

(71) Applicant: USHIO DENKI KABUSHIKI KAISHA, Tokyo (JP)

(72) Inventors: Masaki Inoue, Hyogo (JP); Seiji Kitamura, Hyogo (JP); Kiyoyuki Kabuki, Hyogo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 106 days.

(21) Appl. No.: 14/817,755

(22) Filed: Aug. 4, 2015

(65) Prior Publication Data

US 2016/0061391 A1 Mar. 3, 2016

Related U.S. Application Data

(63) Continuation of application No. PCT/JP2014/052438, filed on Feb. 3, 2014.

(30) Foreign Application Priority Data

Feb. 4, 2013 (JP) ................................ 2013-019494

(51) Int. Cl.
*F21V 9/16* (2006.01)
*F21K 99/00* (2016.01)
(Continued)

(52) U.S. Cl.
CPC ................. *F21K 9/56* (2013.01); *F21K 9/64* (2016.08); *F21V 5/005* (2013.01); *F21V 9/16* (2013.01);
(Continued)

(58) Field of Classification Search
CPC .................................. F21K 9/64; F21V 5/005
See application file for complete search history.

(56) References Cited

U.S. PATENT DOCUMENTS

2005/0270775 A1 12/2005 Harbers et al.
2010/0295438 A1* 11/2010 Ott ............................ F21V 9/16
313/46
(Continued)

FOREIGN PATENT DOCUMENTS

JP 2005-347263 A 12/2005
JP 2006-024615 A 1/2006
(Continued)

OTHER PUBLICATIONS

International Search Report from International Application No. PCT/2014/052438; Filed: Feb. 3, 2014. (Form PCT/ISA/210).
(Continued)

*Primary Examiner* — Evan Dzierzynski
(74) *Attorney, Agent, or Firm* — Michael Best & Friedrich LLP

(57) ABSTRACT

Provided is a fluorescence-emitting light source unit that includes a wavelength conversion member having a light receiving surface and a phosphor. The light receiving surface is configured to receive excitation light, and the phosphor is configured to convert the excitation light received by the light receiving surface into fluorescence and emit the fluorescence. The light receiving surface includes a cyclic structure having projections, in which the projections are cyclically arrayed and each have a substantially cone shape. An aspect ratio is about 0.2 or greater, in which the aspect ratio is a ratio of a height of any of the projections to a pitch of the array of the projections. The pitch of the array is of a size that falls within a range in which diffraction of the fluorescence emitted from the phosphor occurs.

17 Claims, 4 Drawing Sheets

(51) Int. Cl.
  *H01L 33/50* (2010.01)
  *G03B 21/20* (2006.01)
  *F21V 5/00* (2018.01)
  *F21K 9/64* (2016.01)
  *H01S 5/022* (2006.01)
  *F21Y 115/30* (2016.01)
  *F21Y 115/10* (2016.01)

(52) U.S. Cl.
  CPC .......... *G03B 21/204* (2013.01); *H01L 33/505* (2013.01); *F21Y 2115/10* (2016.08); *F21Y 2115/30* (2016.08); *H01S 5/022* (2013.01)

(56) References Cited

U.S. PATENT DOCUMENTS

| | | | |
|---|---|---|---|
| 2011/0090696 A1 | 4/2011 | Nagai et al. | |
| 2011/0157865 A1* | 6/2011 | Takahashi | F21S 48/115 362/84 |
| 2011/0316409 A1* | 12/2011 | Cho | G02B 6/0025 313/483 |
| 2012/0075591 A1 | 3/2012 | Ogura et al. | |
| 2012/0119638 A1 | 5/2012 | Sato et al. | |
| 2012/0224378 A1 | 9/2012 | Koike et al. | |
| 2013/0021587 A1 | 1/2013 | Miyazaki et al. | |

FOREIGN PATENT DOCUMENTS

| | | |
|---|---|---|
| JP | 2007-103901 A | 4/2007 |
| JP | 2011-013316 A | 1/2011 |
| JP | 2011-515848 A | 5/2011 |
| JP | 2011-198560 A | 10/2011 |
| JP | 2012-068465 A | 4/2012 |
| JP | 2012-094741 A | 5/2012 |
| JP | 2012-109400 A | 6/2012 |
| JP | 2012-182376 A | 9/2012 |

OTHER PUBLICATIONS

PCT Written Opinion of the International Searching Authority; International Application No. PCT/JP2014/052438; International Filing Date: Feb. 3, 2014; dated: Apr. 28, 2014. (Form PCT/ISA/220 and PCT/ISA/237).

* cited by examiner

FLUORESCENCE-EMITTING LIGHT SOURCE UNIT

CROSS REFERENCE TO RELATED APPLICATIONS

This is a continuation of International Application No. PCT/JP2014/052438, filed Feb. 3, 2014, which claims the benefit of Japanese Priority Patent Application JP2013-019494, filed Feb. 4, 2013, the entire contents of both of which are incorporated herein by reference.

BACKGROUND

The invention relates to a fluorescence-emitting light source unit that excites a phosphor with use of excitation light to cause the phosphor to emit fluorescence.

A fluorescence-emitting light source unit is known, as a green-light light source used for a projector for example, in which a phosphor is irradiated with laser light serving as excitation light to cause the phosphor to emit green light as fluorescence. As one example of such a fluorescence-emitting light source unit, Japanese Unexamined Patent Application Publication No. 2011-13316 discloses a fluorescence-emitting light source unit that includes a wavelength conversion member in which a surface of a rotary wheel is coated with a phosphor. In the fluorescence-emitting light source unit disclosed in JP2011-13316A, the wavelength conversion member is irradiated with laser light in a blue region to cause the phosphor in the wavelength conversion member to generate light in a green region.

As another example of such a fluorescence-emitting light source unit, Japanese Unexamined Patent Application Publication No. 2011-198560 discloses a fluorescence-emitting light source unit that includes a wavelength conversion member as illustrated in FIG. 10. The wavelength conversion member includes a fluorescent member 41 made of a YAG sintered material and disposed on a surface of a substrate 42 via a barium sulfate layer 43. The substrate 42 is made of an AlN sintered material and provided with a heat sink fin 45 on a back surface thereof. In the fluorescence-emitting light source unit disclosed in JP2011-198560A, the fluorescent member 41 in the wavelength conversion member is irradiated with laser light in a blue region serving as excitation light to generate light in a green region at the fluorescent member 41.

Japanese Unexamined Patent Application Publication No. 2012-109400 proposes to form a corrugated structure on a surface that serves as an excitation light receiving surface of a wavelength conversion member in a fluorescence-emitting light source unit. The corrugated structure suppresses reflection of excitation light at the excitation light receiving surface. More specifically, JP2012-109400A discloses the fluorescence-emitting light source unit provided with the wavelength conversion member in which a translucent substrate is disposed on a fluorescent member. The translucent substrate has the corrugated structure including projections that are arrayed on a surface thereof, and the surface of the translucent substrate serves as the excitation light receiving surface. In the fluorescence-emitting light source unit disclosed in JP2012-109400A, the fluorescent member has a configuration in which a phosphor is dispersed in a sealant. The sealant is made of a glass material such as inorganic glass, or a resin material such as a silicone resin. The translucent substrate is made of a material having high heat conductivity, such as sapphire.

SUMMARY

A fluorescence-emitting light source unit provided with a rotary wheel as disclosed in JP2011-13316A is disadvantageous in that components in a motor that drives and rotates the rotary wheel are subjected to easier deterioration and a structure of a drive system itself is complex as well. Also, the fluorescence-emitting light source unit disclosed in JP2011-198560A is disadvantageous in that the excitation light experiences backscattering at a surface of the fluorescent member 41 upon irradiation of the fluorescent member 41 with the excitation light, preventing the excitation light from being incorporated into the fluorescent member 41 sufficiently. As a result, it is not possible to achieve high efficiency of light emission. Further, in the fluorescence-emitting light source unit disclosed in JP2012-109400A, a part of fluorescence radiated from the phosphor inside the fluorescent member experiences total reflection due to critical angle reflection that occurs as a result of a difference in refractive index between the wavelength conversion member (more specifically, the fluorescent member or the translucent substrate) and the air. Consequently, the part of fluorescence is prevented from being outputted from the surface of the translucent substrate or from a fluorescence-output surface configured by the surface and side surfaces of the fluorescent member, and is subjected to repeated reflection inside the translucent substrate to be outputted from the side surfaces to the outside. In this manner, the fluorescence generated inside the wavelength conversion member is prevented from being extracted from the fluorescence-output surface at high efficiency. Hence, the fluorescence is not utilized effectively and high efficiency of light emission is not achieved accordingly. Such circumstances are attributable to the total reflection, due to the critical angle reflection, at the fluorescence-output surface of the majority of fluorescence generated inside the wavelength conversion member.

It is desirable to provide a fluorescence-emitting light source unit that makes it possible to achieve high efficiency of light emission.

A fluorescence-emitting light source unit according to an embodiment of the invention includes: a wavelength conversion member having a light receiving surface and a phosphor. The light receiving surface is configured to receive excitation light, and the phosphor is configured to convert the excitation light received by the light receiving surface into fluorescence and emit the fluorescence. The light receiving surface includes a cyclic structure having projections, in which the projections are cyclically arrayed and each have a substantially cone shape. An aspect ratio is about 0.2 or greater, in which the aspect ratio is a ratio of a height of any of the projections to a pitch of the array of the projections. The pitch of the array is of a size that falls within a range in which diffraction of the fluorescence emitted from the phosphor occurs.

In the fluorescence-emitting light source unit according to the above-described embodiment of the invention, the light receiving surface of the wavelength conversion member includes the cyclic structure. The cyclic structure has the projections and the particular aspect ratio. The projections are cyclically arrayed and each have a substantially cone shape. Thus, occurrence of backscattering of the excitation light is suppressed upon irradiation of the light receiving surface with the excitation light. As a result, it is possible to incorporate the excitation light into the wavelength conversion member sufficiently.

Also, the pitch of the array is of the size that falls within the range in which the diffraction of the fluorescence emitted from the phosphor inside the wavelength conversion member occurs. Thus, it is possible to extract, at high efficiency, the fluorescence emitted from the phosphor from the wavelength conversion member to the outside.

According to the foregoing fluorescence-emitting light source unit in the above-describe embodiment of the invention, it is possible to incorporate the excitation light into the wavelength conversion member sufficiently, and to efficiently utilize the fluorescence generated inside the wavelength conversion member to output such fluorescence to the outside at high efficiency. Hence, it is possible to achieve high efficiency of light emission.

It is to be understood that both the foregoing general description and the following detailed description are exemplary, and are intended to provide further explanation of the invention as claimed. Also, effects of the invention are not limited to those described above. Effects achieved by the invention may be those that are different from the above-described effects, or may include other effects in addition to those described above.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the invention.

DETAILED DESCRIPTION

In the following, a fluorescence-emitting light source unit according to an example embodiment of the invention is described in detail with reference to the accompanying drawings. Note that the following description is directed to illustrative examples of the invention and not to be construed as limiting to the invention. Also, factors including, without limitation, arrangement, dimensions, and a dimensional ratio of elements illustrated in each drawing are illustrative only and not to be construed as limiting to the invention.

Figure 1:
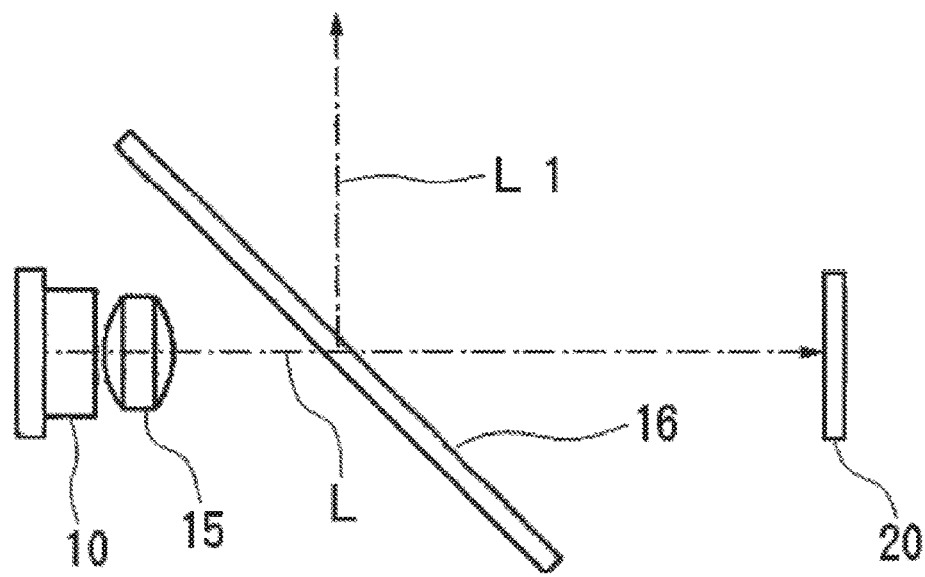
FIG. 1 describes an example of an outline configuration of a fluorescence-emitting light source unit according to an embodiment of the invention.
Figure 2:
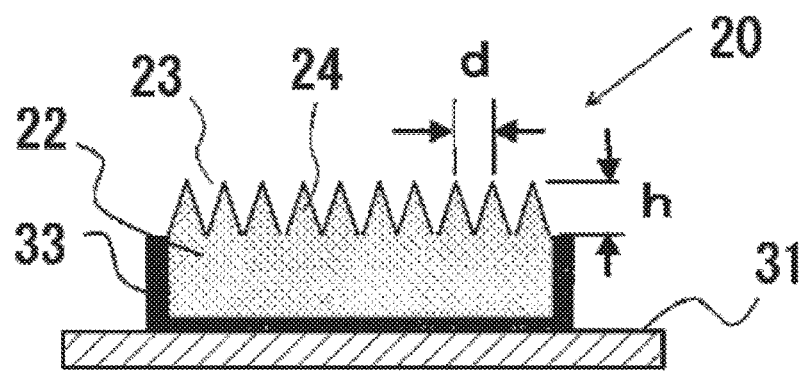
FIG. 2 is an explanatory cross-sectional view of a configuration of a wavelength conversion member in the fluorescence-emitting light source unit illustrated in FIG. 1.

FIG. 1 describes an example of an outline configuration of a fluorescence-emitting light source unit according to an example embodiment of the invention. FIG. 2 is an explanatory cross-sectional view of a configuration of a wavelength conversion member in the fluorescence-emitting light source unit illustrated in FIG. 1.

Referring to FIG. 1, the fluorescence-emitting light source unit may include a laser diode 10 and a fluorescence-emitting member 20. The laser diode 10 may output light in a blue region. The fluorescence-emitting member 20 may be disposed to oppose the laser diode 10. The fluorescence-emitting member 20 may include a wavelength conversion member. The wavelength conversion member may be excited by excitation light L to thereby output fluorescence L1 that may be in a green region without limitation. The excitation light L may be outputted from the laser diode 10 and may be laser light.

A collimator lens 15 may be disposed at a position in proximity to the laser diode 10 between the laser diode 10 and the fluorescence-emitting member 20. The collimator lens 15 may cause the excitation light L received from the laser diode 10 to be in a parallel light beam and output the excitation light L in a form of the parallel light beam. A dichroic mirror 16 may be disposed between the collimator lens 15 and the fluorescence-emitting member 20. The dichroic mirror 16 may cause the excitation light L derived from the laser diode 10 to be transmitted therethrough and cause the fluorescence L1 derived from the wavelength conversion member in the fluorescence-emitting member 20 to be reflected therefrom. The dichroic mirror 16 may be tilted at an angle of, for example but not limited to, 45 degrees with respect to an optical axis of the collimator lens 15.

Referring to FIG. 2, the fluorescence-emitting member 20 may have a configuration in which the wavelength conversion member configured by a fluorescent member 22 is provided on a surface (on an upper surface in FIG. 2) of a substrate 31. The substrate 31 may have a rectangular shape. The fluorescent member 22 may have a shape of a substantially-rectangular plate.

The fluorescence-emitting member 20 may be so disposed that a surface (an upper surface in FIG. 2) of the fluorescent member 22 opposes the laser diode 10. Such a surface of the fluorescent member 22 may serve both as an excitation light receiving surface and a fluorescence-output surface.

A back surface (a lower surface in FIG. 2) and side surfaces of the fluorescent member 22 each may be provided with a light reflection film 33. The light reflection film 33 may be made of, for example but not limited to, silver. Providing each of the back surface and the side surfaces of the fluorescent member 22 with the light reflection film 33 allows the fluorescent member 22 to have a function of reflection at the back surface and the side surfaces thereof. An unillustrated bonding member may be interposed between the light reflection film 33 and the substrate 31. The fluorescent member 22 may be bonded onto the substrate 31 by the bonding member. The bonding member may be made of a material that has heat conductivity of 40 W/mK or higher in terms of dissipating heat. Non-limiting examples of the material may include a solder and a silver sintered material. A back surface of the substrate 31 may be disposed with an unillustrated heat sink fin.

The fluorescent member 22 structuring the wavelength conversion member includes a cyclic structure 23 on the excitation light receiving surface, i.e., on the surface of the fluorescent member 22. The cyclic structure 23 has a configuration in which projections 24 are cyclically arrayed.

The fluorescent member 22 contains a phosphor. The fluorescent member 22 may be made of, for example but not limited to, a monocrystalline phosphor, a polycrystalline phosphor, an eutectic material of a phosphor and a ceramic, or a sintered material of a mixture of a phosphor and a glass binder. The fluorescent member 22 may have a thickness in a range from, for example but not limited to, 0.05 mm to 2.0 mm in terms of efficiency in conversion from the excitation light into the fluorescence (a quantum yield) and a heat dissipating property.

In one example embodiment where the fluorescent member 22 is made of a monocrystalline phosphor, a polycrystalline phosphor, an eutectic material of a phosphor and a ceramic, or a sintered material of a mixture of a phosphor and a glass binder, the fluorescent member 22 has high heat conductivity. This makes it possible to efficiently dissipate heat generated by the irradiation of the fluorescent member 22 with the excitation light, and thereby to suppress an increase in temperature of the fluorescent member 22 to a high temperature. As a result, it is possible to suppress a reduction in light amount of the fluorescence attributed to occurrence of thermal quenching in the phosphor.

The monocrystalline phosphor configuring the fluorescent member 22 may be obtained by, for example but not limited to, a Czochralski method. More specifically, a seed crystal may be brought into contact with a molten material in a crucible. In this state, the seed crystal may be raised vertically while being rotated to grow a monocrystal on the seed layer, whereby the monocrystalline phosphor may be obtained.

The polycrystalline phosphor configuring the fluorescent member 22 may be obtained by the following non-limiting example. First, raw materials such as, but not limited to, a matrix, an activator, and an sintering aid may be crushed using, such as, but not limited to, a ball mill to obtain raw material particles in the order of sub-micrometers or less, following which the raw material particles may be sintered using, for example but not limited to, a slip casting method. The thus-obtained sintered material may be subjected to, for example but not limited to, a hot isostatic pressing, whereby the polycrystalline phosphor having porosity of 0.5% or less may be obtained.

In one example embodiment where the fluorescent member 22 is made of the monocrystalline phosphor or the polycrystalline phosphor, non-limiting specific examples of the phosphor configuring such a fluorescent member 22 may include YAG:Ce, YAG:Pr, YAG:Sm, and LuAG:Ce. In each of such phosphors, a rare-earth element may have a dope amount of about 0.5 mol %.

The fluorescent member 22 may have high heat conductivity of 11 W/mK or higher in one example embodiment where the fluorescent member 22 is made of the monocrystalline phosphor or the polycrystalline phosphor.

The heat conductivity of 11 W/mK or higher of the fluorescent member 22 makes it possible to further suppress the reduction in light amount of the fluorescence attributed to the occurrence of the thermal quenching in the phosphor.

In one example embodiment where the fluorescent member 22 is made of an eutectic material of a phosphor and a ceramic, the eutectic material configuring such a fluorescent member 22 may specifically be, for example but not limited to, an eutectic material in which YAG is used for a phosphor and an aluminum oxide ($Al_2O_3$) is used for a ceramic material. The eutectic material configured by the YAG and the aluminum oxide has a constitution in which a YAG component and an aluminum oxide component are entwined with each other three-dimensionally. In this eutectic material, fluorescence emitted from the phosphor configuring the YAG component reaches the surface, serving as the fluorescence-output surface of the wavelength conversion member, of the fluorescent member 22 while being diffused at an interface between the YAG component and the aluminum oxide component, whereby the fluorescence is extracted from the surface to the outside. Note that, when a surface of a fluorescent member serving as a fluorescence-output surface is flat, fluorescence experiences total reflection due to critical angle reflection that occurs as a result of a difference in refractive index between the fluorescent member and the air, preventing the fluorescence from being extracted from the fluorescence-output surface to the outside.

In one example embodiment where the fluorescent member 22 is made of a sintered material of a mixture of a phosphor and a glass binder, the sintered material may be, for example but not limited to, a sintered material in which low-melting-point glass and a sol-gel material are used as a glass binder, and in which the glass binder and a phosphor are mixed and the mixture is sintered at a low temperature. The glass binder in such a sintered material has a low melting point in a range from about 300° C. to 400° C., making it possible to use any of various kinds of phosphors for the phosphor. Non-limiting specific examples of such phosphors may include blue phosphors such as BAM and CMS, green phosphors such as YAG, LuAG and β sialon, and red phosphors such as CASN and SCASN. In the sintered material of the mixture of the monocrystalline phosphor (or the polycrystalline phosphor) and the glass binder, fluorescence emitted from the phosphor reaches the surface, serving as the fluorescence-output surface of the wavelength conversion member, of the fluorescent member 22 while being diffused at an interface between the phosphor and the glass binder, whereby the fluorescence is extracted from the surface to the outside. Note that, when a surface of a fluorescent member serving as a fluorescence-output surface is flat, the majority of fluorescence experience total reflection due to critical angle reflection that occurs as a result of a difference in refractive index between the fluorescent member and the air, preventing the fluorescence from being extracted from the fluorescence-output surface to the outside.

The sol-gel material used as the glass binder may specifically be, for example but not limited to, a sol material derived from a thermal treatment (such as hydrolysis and condensation polymerization) of alkoxide that contains an element such as silicon, titanium, and zirconium. A progress in reaction by means of the thermal treatment results in an inorganic material as the sol material.

Referring to FIG. 2, the projections 24 structuring the cyclic structure 23 on the surface of the fluorescent member 22 each have a substantially cone shape having a diameter that decreases from a back surface toward a front surface.

Figure 3:
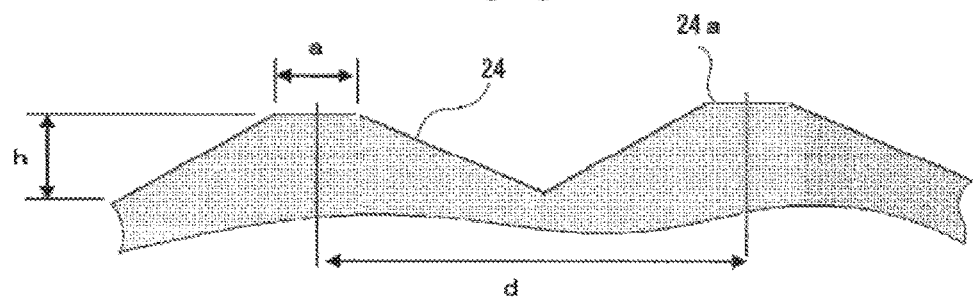
FIG. 3 schematically describes a cyclic structure in the wavelength conversion member according to a modification example.

The projections 24 each may specifically have a substantially cone shape such as, but not limited to, a shape of a cone as illustrated in FIG. 2 (a circular cone in one example illustrated in FIG. 2) and a shape of a frustum as illustrated in FIG. 3.

In one embodiment where the projections 24 each have the frustum shape, an upper base 24a may have a dimension (a maximum dimension) "a" that is less than a wavelength of the excitation light L. In a non-limiting example where the projections 24 each have a shape of a circular truncated cone and the excitation light L has a wavelength of 445 nm, the dimension "a" (an outer diameter) of the upper base 24a of any of the circular-truncated-cone-shaped projections 24 may be 100 nm.

The projections 24 each have the substantially cone shape, making it possible to prevent or suppress reflection of the excitation light L at the surface of the fluorescent member 22 for one reason as discussed below.

Figure 4:
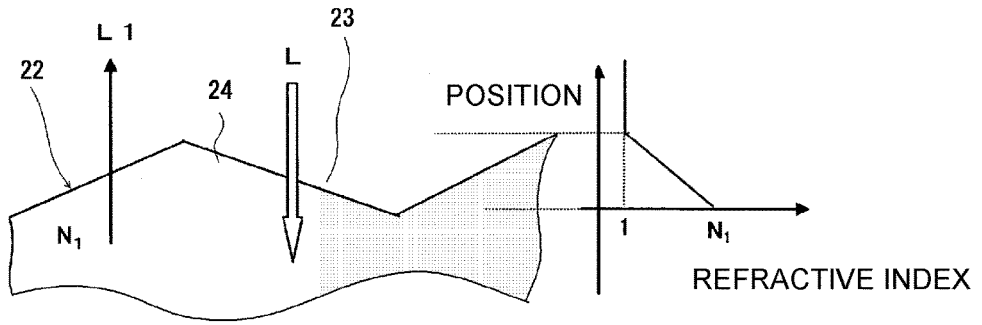
FIG. 4 macroscopically illustrates a variation in refractive index of media through which excitation light propagates, when the excitation light enters the wavelength conversion member configured by a fluorescent member in a direction perpendicular to a surface of the wavelength conversion member.

FIG. 4 macroscopically illustrates a variation in refractive index of media through which the excitation light L propagates, when the excitation light L enters the fluorescent member 22 in a direction perpendicular to the surface of the fluorescent member 22. In FIG. 4, a cross-sectional view on the left side schematically illustrates a part of the fluorescent member 22 in an enlarged fashion, whereas a graph on the right side illustrates a macroscopic relationship of a position in the direction perpendicular to the surface of the fluorescent member 22 versus the refractive index.

Referring to FIG. 4, the excitation light L enters the fluorescent member 22 in a direction oblique to a tapered surface of any projection 24 structuring the cyclic structure 23 when the surface of the fluorescent member 22 (having a refractive index of $N_1$) is irradiated with the excitation light L from the air (having a refractive index of 1). In macroscopic point of view, the refractive indices of the respective media through which the excitation light L propagates vary gradually from 1 to $N_1$ in the direction perpendicular to the surface of the fluorescent member 22. Thus, the surface of the fluorescent member 22 virtually has no presence of an interface at which the refractive index varies rapidly, making it possible to prevent or suppress the reflection of the excitation light L at the surface of the fluorescent member 22.

In each of the substantially-cone-shaped projections 24 structuring the cyclic structure 23, an inclination angle of a tapered surface (a side surface), or an angle between the side surface and a bottom surface, may be preferably 11 degrees or greater.

The inclination angle of less than 11 degrees of the tapered surface may cause the tapered surface to serve as a boundary surface of two media that are different in refractive index from each other, which may result in generation of reflection light based on a difference in refractive index between the air and the fluorescent member.

The cyclic structure 23 has a pitch "d" of a size that falls within a range (Bragg's condition) in which diffraction of the fluorescence L1 emitted from the phosphor that configures the fluorescent member 22 occurs.

More specifically, the pitch "d" of the cyclic structure 23 may have a value (hereinafter referred to as an "optical length") obtained as a result of the division of a peak wavelength of the fluorescence L1 emitted from the phosphor by a refractive index of a material configuring the cyclic structure 23 (in an illustrated example, a refractive index of the phosphor configuring the fluorescent member 22). The pitch "d" of the cyclic structure 23 may alternatively have a value about the multiple of the optical length.

In example embodiments of the invention, the term "pitch" of the cyclic structure refers to a distance, or a center-to-center distance, in nm from one projection to another projection adjacent thereto in the cyclic structure.

The pitch "d" of the cyclic structure 23 is of the size that falls within the range in which the diffraction of the fluorescence L1 generated inside the fluorescent member 22 occurs, making it possible to extract the fluorescence L1 from the surface of the fluorescent member 22 to the outside at high efficiency, as described in greater detail below.

Figure 5:
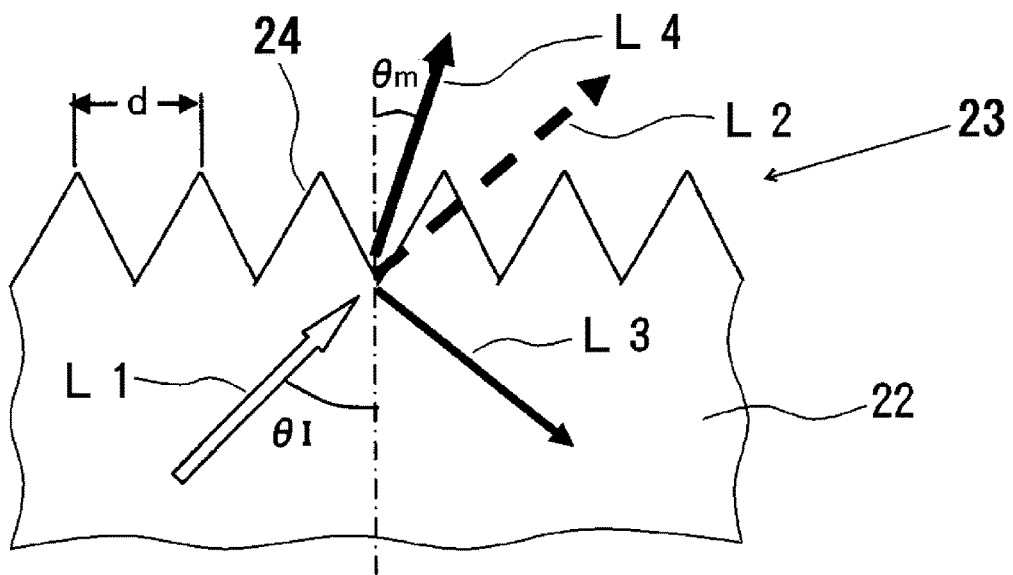
FIG. 5 schematically describes reflection and diffraction of fluorescence at the surface of the fluorescent member.

Referring to FIG. 5, the fluorescence L1 generated inside the fluorescent member 22 is extracted, as transmission light L2 that passes through the surface of the fluorescent member 22, from the surface of the fluorescent member 22 to the outside without experiencing reflection, when an incidence angle θI relative to the surface of the fluorescent member 22, or to an interface between the fluorescent member 22 and the air, is less than a critical angle. When the incidence angle θI of the fluorescence L1 relative to the surface of the fluorescent member 22 is equal to or greater than the critical angle and if, for example, the surface of the fluorescent member 22 is a flat surface, the fluorescence L1 experiences the total reflection at the surface of the fluorescent member 22 and thus travels toward the inside of the fluorescent member 22 as reflection light L3, preventing the fluorescence L1 from being extracted from the surface of the fluorescent member 22 to the outside. In contrast, providing the surface of the fluorescent member 22 with the cyclic structure 23 having the pitch "d" that satisfies the above-described condition causes the diffraction of the fluorescence L1 at the surface of the fluorescent member 22 by virtue of the cyclic structure 23. As a result, the fluorescence L1 is outputted, as negative first-order diffraction light L4, from the surface of the fluorescent member 22 at an output angle of θm (θm<θI) to be extracted therefrom to the outside.

An aspect ratio, as a ratio (h/d) of a height "h" of any projection 24 to the pitch "d" in the cyclic structure 23 is 0.2 or greater, preferably in a range from 0.2 to 1.5, and more preferably in a range from 0.5 to 1.0.

The aspect ratio (h/d) of less than 0.2 causes the surface of the fluorescent member 22 to be close to the flat surface, which may prevent an effect derived from the diffraction from being obtained sufficiently and thus may prevent high efficiency of light extraction from being achieved.

The cyclic structure 23 may be formed using, for example but not limited to, a nanoimprint method and a dry etching method. For example, a surface of a fluorescent member, having a shape of a substantially-rectangular plate, may be coated with a resist using a spin coat method, following which a thus-obtained resist-coated film may be patterned using the nanoimprint method. Thereafter, an exposed region on the surface of the fluorescent member may be subjected to the dry etching method, whereby the cyclic structure 23 may be formed.

An aluminum substrate or the like with a heat dissipating adhesive may be used as a component of the substrate 31. The heat dissipating adhesive may include a resin mixed with metal fine powder. The substrate 31 may have a thickness in a range from 0.5 mm to 1.0 mm without limitation. The aluminum substrate may also serve as a heat sink fin.

In the foregoing fluorescence-emitting light source unit according to the example embodiment, the excitation light L which may be the laser light in the blue region outputted from the laser diode 10 may be caused to be in the form of the parallel light beam by the collimator lens 15. The excitation light L in the form of the parallel light beam may then be transmitted through the dichroic mirror 16 to be applied substantially perpendicular to the excitation light receiving surface of the wavelength conversion member in the fluorescence-emitting member 20, i.e., to the surface of the fluorescent member 22 in the fluorescence-emitting member 20. In the fluorescent member 22, the phosphor configuring the fluorescent member 22 may be excited to emit the fluorescence L1. The fluorescence L1 may be outputted from the fluorescence-output surface of the wavelength conversion member, i.e., from the surface of the fluorescent member 22, following which the thus-outputted fluorescence L1 may be reflected perpendicularly by the dichroic mirror 16 to be outputted to the outside of the fluorescence-emitting light source unit.

In the fluorescence-emitting light source unit according to the example embodiment, the surface, serving as the excitation light receiving surface of the wavelength conversion member, of the fluorescent member 22 includes the cyclic structure 23 having the projections 24. The projections 24 each have the substantially cone shape, and are cyclically arrayed in the cyclic structure 23. The cyclic structure 23 has the aspect ratio of 0.2 or greater. Thus, occurrence of backscattering of the excitation light L is suppressed upon the irradiation of the surface of the fluorescent member 22 with the excitation light L. As a result, it is possible to incorporate the excitation light L into the fluorescent member 22 sufficiently.

Also, the pitch "d" of the cyclic structure 23 is of the size that falls within the range in which the diffraction of the fluorescence L1 emitted from the phosphor configuring the fluorescent member 22 occurs. Thus, it is possible to extract, at high efficiency, the fluorescence L1 emitted from the phosphor configuring the fluorescent member 22 from the surface, serving as the fluorescence-output surface of the wavelength conversion member, of the fluorescent member 22 to the outside.

According to the foregoing fluorescence-emitting light source unit in the example embodiment, it is possible to incorporate the excitation light L into the wavelength conversion member sufficiently, and to efficiently utilize the fluorescence L1 generated inside the wavelength conversion member to output such fluorescence L1 to the outside at high efficiency. Hence, it is possible to achieve high efficiency of light emission.

Also, in the fluorescence-emitting light source unit according to the example embodiment, the fluorescent member 22 may include the back surface and the side surfaces each having the reflection function. Thus, the excitation light receiving surface and the fluorescence-output surface of the wavelength conversion member may be configured by the same surface, i.e., by the surface of the fluorescent member 22. This makes it possible to prevent the fluorescence from being outputted to the outside from portions other than the surface of the fluorescent member 22, and to cause the area of the surface that receives the excitation light in the wavelength conversion member to be substantially the same as the area of the surface that outputs the fluorescence in the wavelength conversion member. Hence, it is possible to maximize luminance at the fluorescence-output surface.

In addition, the entire part of the back surface of the fluorescent member 22 may be in contact with the heat sink fin via the substrate 31. Thus, a high heat dissipating property is achieved, making it possible to further suppress the reduction in light amount of the fluorescence attributed to the occurrence of the thermal quenching in the phosphor. Hence, it is possible to achieve higher efficiency of light emission.

Further, in the fluorescence-emitting light source unit according to the example embodiment, the fluorescent member 22 may be made of one of the monocrystalline phosphor, the polycrystalline phosphor, the eutectic material of the phosphor and the ceramic, and the sintered material of the mixture of the phosphor and the glass binder. This makes it possible to efficiently conduct heat generated in the fluorescent member 22 to the substrate 31 and the heat sink fin, and thus to dissipate the heat toward the back surface of the fluorescent member 22. Thus, an increase in temperature of the fluorescent member 22 is suppressed, making it possible to suppress the reduction in light amount of the fluorescence attributed to the occurrence of the thermal quenching in the phosphor. As a result, an increase in temperature of the wavelength conversion member is suppressed. Hence, it is possible to achieve higher efficiency of light emission.

Figure 6:
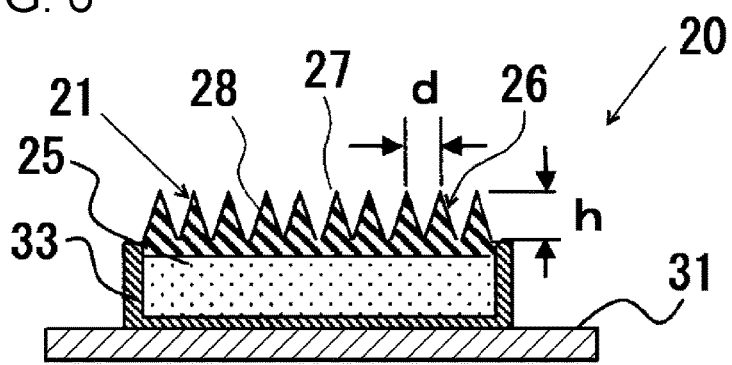
FIG. 6 is an explanatory cross-sectional view of a configuration of the wavelength conversion member in the fluorescence-emitting light source unit according to another embodiment of the invention.

FIG. 6 is an explanatory cross-sectional view of a configuration of a wavelength conversion member in the fluorescence-emitting light source unit according to another example embodiment of the invention.

Referring to FIG. 6, a wavelength conversion member 21 structuring the fluorescence-emitting member 20 may be provided on the substrate 31. The substrate 31 may have a rectangular shape. The wavelength conversion member 21 may include a fluorescent member 25 and a cyclic structure layer 26. The fluorescent member 25 may have a shape of a substantially-rectangular plate. The cyclic structure layer 26 may be provided on a surface (on an upper surface in FIG. 6) of the fluorescent member 25, and having a surface (an upper surface in FIG. 6) on which a cyclic structure 27 is provided. The cyclic structure 27 provided on the surface of the cyclic structure layer 26 may have a configuration in which projections 28 are cyclically arrayed. The projections 28 each may have a substantially cone shape (in one embodiment, a circular cone shape).

The surface of the cyclic structure layer 26 in the wavelength conversion member 21 may serve both as the excitation light receiving surface and the fluorescence-output surface.

A back surface (a lower surface in FIG. 6) and side surfaces of the fluorescent member 25 each may be provided with the light reflection film 33. The light reflection film 33 may be made of, for example but not limited to, silver. Providing each of the back surface and the side surfaces of the fluorescent member 25 with the light reflection film 33 allows the wavelength conversion member 21 to have the reflection function at the back surface and the side surfaces thereof. The back surface of the substrate 31 may be disposed with the unillustrated heat sink fin. The configurations of the substrate 31 and the fluorescent member 25 may be similar to those of the fluorescence-emitting light source unit according to the example embodiment illustrated in FIG. 1, with the exception that the cyclic structure is not directly provided on the surface of the fluorescent member 25.

The cyclic structure 27 provided on the surface of the cyclic structure layer 26 has an aspect ratio, as a ratio (h/d)

of a height "h" of any projection 28 to the pitch "d", of 0.2 or greater, preferably in a range from 0.2 to 1.5, and more preferably in a range from 0.5 to 1.0. The aspect ratio in the cyclic structure 27 of equal to or greater than 0.2 makes it possible to prevent or suppress the reflection of the excitation light at the surface of the cyclic structure layer 26.

The pitch "d" of the cyclic structure 27 is of the size that falls within the range in which the diffraction of the fluorescence emitted from the phosphor configuring the fluorescent member 25 occurs. Satisfying such a condition makes it possible to extract, at high efficiency, the fluorescence emitted from the phosphor configuring the fluorescent member 25 from the surface of the cyclic structure layer 26 to the outside.

A material configuring the cyclic structure layer 26 may preferably have a refractive index equal to or higher than a refractive index of the fluorescent member 25. Configuring the cyclic structure layer 26 by the material having the higher refractive index than that of the fluorescent member 25 avoids the reflection of the fluorescence at an interface between the fluorescent member 25 and the cyclic structure layer 26, making it possible to keep the efficiency of light emission of the fluorescence derived from the fluorescent member 25. In particular, the cyclic structure layer 26 configured by the material having the higher refractive index than that of the fluorescent member 25 causes refraction of the fluorescence that has entered the interface between the fluorescent member 25 and the cyclic structure layer 26 when the fluorescence is transmitted through the interface. This allows a traveling direction of the fluorescence to be varied at the interface between the fluorescent member 25 and the cyclic structure layer 26, suppressing trapping of the fluorescence inside the wavelength conversion member 21. Hence, it is possible to extract the fluorescence from the surface of the cyclic structure layer 26 to the outside at high efficiency.

Also, using the material having the higher refractive index than that of the fluorescent member 25 for the cyclic structure layer 26 makes it possible to form the cyclic structure 27 having the small pitch "d". This allows for designing of the projections 28 structuring the cyclic structure 27 which are large in aspect ratio but small in height, making it easier to form the cyclic structure 27. More specifically, for example, fabrication of a mold or a template and performing of an imprint work are facilitated in a case of utilizing a nanoprint method. The energy that excites the phosphor in the wavelength conversion member 21 provided with the cyclic structure 27 may have an excitation density of about 5 W/mm$^2$ or higher; hence, the material configuring the cyclic structure layer 26 may preferably be an inorganic material.

Non-limiting examples of the material configuring the cyclic structure layer 26 may include silica, titania, zirconia, and a silicon nitride. Silica may have a refractive index in a range from 1.45 to 1.7, titania may have a refractive index in a range from 1.9 to 2.2, zirconia may have a refractive index in a range from 1.7 to 1.8, and a silicon nitride may have a refractive index in a range from 1.7 to 2.0. The cyclic structure layer 26 may have a thickness in a range from 0.1 μm to 1.0 μm without limitation.

The cyclic structure layer 26 may be formed using, for example but not limited to, a sol-gel method and a nanoimprint method. For example, the surface of the fluorescent member 25 may be coated with the sol material including alkoxide that contains an element such as, but not limited to, silicon, titanium, and zirconium with use of a spin coat method followed by heating that may be performed while a mold or a template is pressed against the fluorescent member 25 having the sol-material-coated surface. Thereafter, the mold or the template may be removed to perform the thermal treatment. The thermal treatment progresses the reaction (such as hydrolysis and condensation polymerization), whereby the cyclic structure layer 26 which may be made of the inorganic material may be formed.

In the foregoing fluorescence-emitting light source unit according to another example embodiment, the excitation light which may be the laser light in the blue region outputted from the laser diode may be caused to be in the form of the parallel light beam by the collimator lens. The excitation light in the form of the parallel light beam may then be transmitted through the dichroic mirror to be applied substantially perpendicular to the excitation light receiving surface of the wavelength conversion member 21 in the fluorescence-emitting member 20, i.e., to the surface of the cyclic structure layer 26 in the fluorescence-emitting member 20, to enter the fluorescent member 25 through the cyclic structure layer 26. In the fluorescent member 25, the phosphor configuring the fluorescent member 25 may be excited to emit the fluorescence in the fluorescent member 25. The fluorescence may be outputted from the fluorescence-output surface, i.e., from the surface of the cyclic structure layer 26, following which the thus-outputted fluorescence may be reflected perpendicularly by the dichroic mirror to be outputted to the outside of the fluorescence-emitting light source unit.

In the fluorescence-emitting light source unit according to another example embodiment, the wavelength conversion member 21 has a configuration in which the cyclic structure layer 26 is provided on the surface of the fluorescent member 25, and the surface of the cyclic structure layer 26 serves as the excitation light receiving surface. Also, the surface of the cyclic structure layer 26 includes the cyclic structure 27 having the projections 28. The projections 28 each have the substantially cone shape, and are cyclically arrayed in the cyclic structure 27. The cyclic structure 27 has the aspect ratio of 0.2 or greater. Thus, occurrence of backscattering of the excitation light is suppressed upon the irradiation of the surface, serving as the excitation light receiving surface of the wavelength conversion member 21, of the cyclic structure layer 26 with the excitation light. As a result, it is possible to incorporate the excitation light into the fluorescent member 25 of the wavelength conversion member 21 sufficiently.

Also, the pitch "d" of the cyclic structure 27, provided on the surface of the cyclic structure layer 26 in the wavelength conversion member 21, is of the size that falls within the range in which the diffraction of the fluorescence emitted from the phosphor configuring the fluorescent member 25 occurs. Thus, it is possible to extract, at high efficiency, the fluorescence emitted from the phosphor configuring the fluorescent member 25 from the surface, serving as the fluorescence-output surface of the wavelength conversion member 21, of the cyclic structure layer 26 to the outside.

In the foregoing fluorescence-emitting light source unit according to another example embodiment, it is possible to incorporate the excitation light L into the wavelength conversion member 21 sufficiently, and to efficiently utilize the fluorescence generated inside the wavelength conversion member 21 to output such fluorescence to the outside at high efficiency. Hence, it is possible to achieve high efficiency of light emission.

The wavelength conversion member 21 in the fluorescence-emitting light source unit according to another example embodiment includes the fluorescent member 25 and the cyclic structure layer 26. This eliminates the necessity of providing the fluorescent member 25 with the cyclic structure, making it easier to form the the fluorescent member 25. In addition, the cyclic structure layer 26 which may be made of, for example but not limited to, the inorganic material is provided separately from the fluorescent member 25, making it easier to control a shape and the aspect ratio of the cyclic structure 27.

Also, the material having the refractive index higher than the refractive index of the fluorescent member 25 may be used as the material configuring the cyclic structure layer 26. This avoids the reflection of the fluorescence at the interface between the fluorescent member 25 and the cyclic structure layer 26, making it possible to keep the efficiency of light emission of the fluorescence derived from the fluorescent member 25. In addition thereto, this allows the traveling direction of the fluorescence to be varied at the interface between the fluorescent member 25 and the cyclic structure layer 26, suppressing the trapping of the fluorescence inside the wavelength conversion member 21. Hence, it is possible to extract the fluorescence from the surface of the cyclic structure layer 26 to the outside at high efficiency. Hence, it is possible to achieve higher efficiency of light emission.

In the fluorescence-emitting light source unit according to another example embodiment, the wavelength conversion member 21 may include the back surface and the side surfaces each having the reflection function. Thus, the excitation light receiving surface and the fluorescence-output surface of the wavelength conversion member 21 may be configured by the same surface, i.e., by the surface of the cyclic structure layer 26. This makes it possible to prevent the fluorescence from being outputted to the outside from portions other than the surface of the cyclic structure layer 26, and to cause the area of the surface that receives the excitation light in the wavelength conversion member 21 to be substantially the same as the area of the surface that outputs the fluorescence in the wavelength conversion member 21. Hence, it is possible to maximize the luminance at the fluorescence-output surface.

In addition, the entire part of the back surface of the wavelength conversion member 21 may be in contact with the heat sink fin via the substrate 31. Thus, the high heat dissipating property is achieved, making it possible to further suppress the reduction in light amount of the fluorescence attributed to the occurrence of the thermal quenching in the phosphor. Hence, it is possible to achieve higher efficiency of light emission.

Further, in the fluorescence-emitting light source unit according to another example embodiment, the fluorescent member 25 may be made of one of the monocrystalline phosphor, the polycrystalline phosphor, the eutectic material of the phosphor and the ceramic, and the sintered material of the mixture of the phosphor and the glass binder. This makes it possible to efficiently conduct heat generated in the fluorescent member 25 to the substrate 31 and the heat sink fin, and thus to dissipate the heat toward the back surface of the fluorescent member 25. Thus, an increase in temperature of the fluorescent member 25 is suppressed, making it possible to suppress the reduction in light amount of the fluorescence attributed to the occurrence of the thermal quenching in the phosphor. As a result, an increase in temperature of the wavelength conversion member 21 is suppressed. Hence, it is possible to achieve higher efficiency of light emission.

Although the description is given above of some example embodiments of the invention, the invention is not limited thereto but may be modified in a wide variety of ways.

For example, one or both of the back surface and the side surfaces of the wavelength conversion member may have the light reflecting function, although the wavelength conversion member is adapted to prevent output of the fluorescence generated inside the wavelength conversion member and hence it is preferable that the side surfaces have the light reflecting function as illustrated in FIGS. 2 and 6. In one example embodiment, only one or more of the side surfaces of the wavelength conversion member may be provided with the light reflection film, and the front surface and the back surface of the wavelength conversion member each may serve as the fluorescence-output surface.

Also, a configuration of the fluorescence-emitting light source unit as a whole is not limited to the example configuration illustrated in FIG. 1, and any of various configurations may be employed for the fluorescence-emitting light source unit.

For example, the fluorescence-emitting light source unit according to the example embodiment illustrated in FIG. 1 uses light derived from a single laser light source that may be, for example but not limited to, the laser diode 10. In an alternative embodiment, a configuration may be employed in which a plurality of laser light sources are provided, and a condenser lens is disposed upstream of the wavelength conversion member to irradiate the wavelength conversion member with the light condensed by the condenser lens. Further, the excitation light is not limited to the light derived from the laser light source. Any light including, without limitation, condensed light derived from an LED and light derived from a lamp enclosed therein with mercury, xenon, etc., may be used as long as such light makes it possible to excite the wavelength conversion member. Note that, when a light source that emits light having a range in emission wavelength is utilized, such as the lamp and the LED, the wavelength of the excitation light is based on a predominant region of the emission wavelength in the light emitted from such a light source, although the invention is not limited thereto.

In the following, a description is given of some Experimental Examples of the invention. It should be understood that these Experimental Examples are illustrative, and should not be construed as being limiting in any way.

Experimental Example 1

A plurality of wavelength conversion members having their respective cyclic structures on surfaces were fabricated based on the configuration illustrated in FIG. 2.

The fabricated wavelength conversion members were different from each other in aspect ratio of the cyclic structure. In each of the wavelength conversion members, the projections (24) were circular cone in shape and had the height (h) that was varied in a range from 100 nm to 1100 nm to adjust the aspect ratio. Also, the wavelength conversion members each had the pitch (d) of 600 nm where the pitch (d) was of the size falling within the range in which the diffraction of the fluorescence emitted from the phosphor configuring the fluorescent member (22) occurs, and each had the following specifications.

Substrate (31)
Material: aluminum
Dimensions: 25 mm in height×25 mm in width×1 mm in thickness
Fluorescent Member (22)
Material: monocrystal LuAG:Ce with a composition of $Lu_3Al_5O_{12}$:Ce where a dope amount of Ce was 0.5 mol %, refractive index of 1.85, excitation wavelength of 455 nm, and fluorescence wavelength of 535 nm Dimensions: 1.7 mm in height×3.0 mm in width×130 μm in thickness Light Reflection Film (33)

Material: silver

Thickness: 110 nm

Also, a wavelength conversion member was fabricated that had the similar configuration and specifications as each of the above-described wavelength conversion members having their respective cyclic structures on the surfaces, with the exception that the cyclic structure was not formed.

Figure 7:
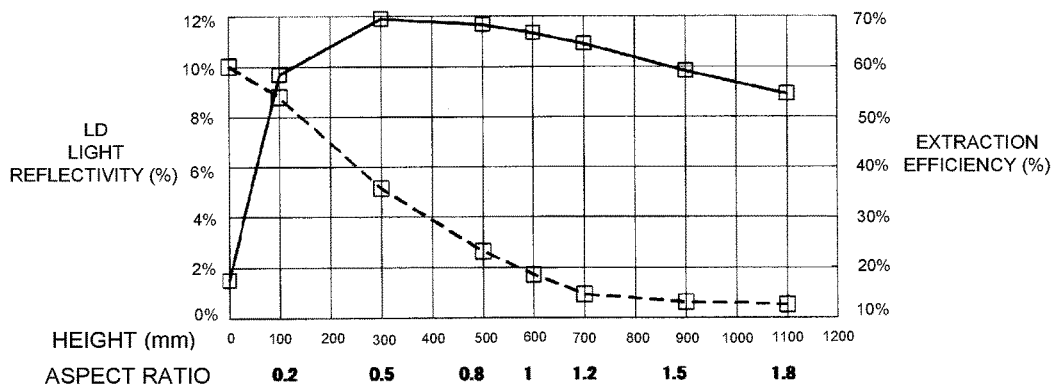
FIG. 7 is a graph showing a relationship of a height of a projection structuring a cyclic structure at a surface of a wavelength conversion member (an aspect ratio of the cyclic structure) versus reflectivity and extraction efficiency of light at the surface of the wavelength conversion member according to Experimental Example 1.

The surface (i.e., the surface of the fluorescent member) of each of the fabricated wavelength conversion members was irradiated with the excitation light that had a peak wavelength of 445 nm to measure reflectivity of light (laser diode (LD) light reflectivity) at the surface and extraction efficiency of light at the surface. FIG. 7 shows results of the measurement, in which a broken line denotes results of the measurement on the reflectivity of light (LD light reflectivity), whereas a solid line denotes results of the measurement on the extraction efficiency of light.

It was confirmed from the measurement results that forming the cyclic structure, including the projections each having the substantially cone shape and that are arrayed at the pitch of the size that falls within the range in which the diffraction of the fluorescence emitted from the phosphor configuring the fluorescent member occurs, on the excitation light receiving surface and causing the aspect ratio of the cyclic structure to be 0.2 or greater make it possible to suppress the reflection of the excitation light at the surface of the wavelength conversion member and to output the fluorescence generated inside the wavelength conversion member to the outside at high efficiency.

Experimental Example 2

Figure 8:
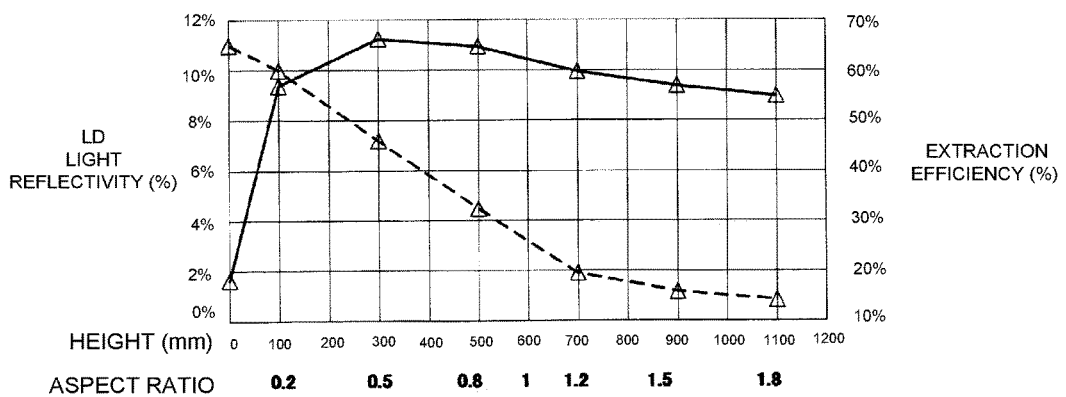
FIG. 8 is a graph showing a relationship of a height of a projection structuring a cyclic structure at a surface of a wavelength conversion member (an aspect ratio of the cyclic structure) versus reflectivity and extraction efficiency of light at the surface of the wavelength conversion member according to Experimental Example 2.

Experimental Example 2 was different from the Experimental Example 1 described above in that a plurality of wavelength conversion members were fabricated using fluorescent members (22) each having a refractive index of 2.0 for their respective fluorescent members in the wavelength conversion members, and in that the fabricated wavelength conversion members were each irradiated with light having a peak wavelength of 465 nm as the excitation light. A technique otherwise similar to that used in the Experimental Example 1 was used to measure reflectivity of light (LD light reflectivity) and extraction efficiency of light at each of the surfaces of the respective wavelength conversion members. FIG. 8 shows results of the measurement, in which a broken line denotes results of the measurement on the reflectivity of light (LD light reflectivity), whereas a solid line denotes results of the measurement on the extraction efficiency of light.

It was confirmed from the measurement results that forming the cyclic structure, including the projections each having the substantially cone shape and that are arrayed at the pitch of the size that falls within the range in which the diffraction of the fluorescence emitted from the phosphor configuring the fluorescent member occurs, on the excitation light receiving surface and causing the aspect ratio of the cyclic structure to be 0.2 or greater make it possible to suppress the reflection of the excitation light at the surface of the wavelength conversion member and to output the fluorescence generated inside the wavelength conversion member to the outside at high efficiency.

Experimental Example 3

Figure 9:
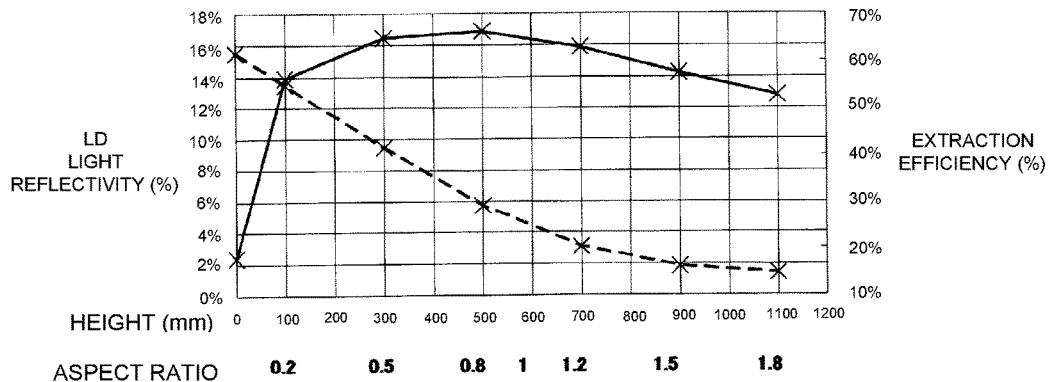
FIG. 9 is a graph showing a relationship of a height of a projection structuring a cyclic structure at a surface of a wavelength conversion member (an aspect ratio of the cyclic structure) versus reflectivity and extraction efficiency of light at the surface of the wavelength conversion member according to Experimental Example 3.
Figure 10:
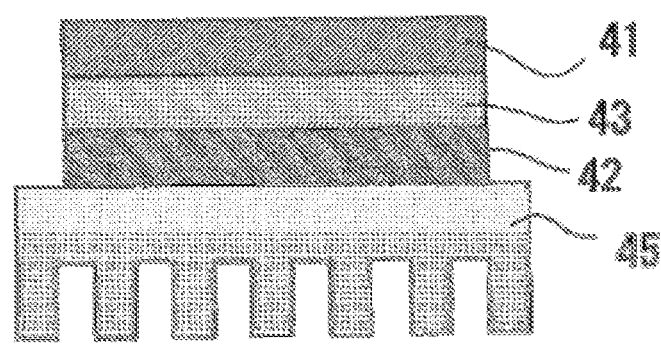
FIG. 10 is an explanatory cross-sectional view of a configuration of a wavelength conversion member in an existing fluorescence-emitting light source unit.

Experimental Example 3 was different from the Experimental Example 1 described above in that a plurality of wavelength conversion members were fabricated using fluorescent members (22) each having a refractive index of 2.3 for their respective fluorescent members in the wavelength conversion members. A technique otherwise similar to that used in the Experimental Example 1 was used to measure reflectivity of light (LD light reflectivity) and extraction efficiency of light at each of the surfaces of the respective wavelength conversion members. FIG. 9 shows results of the measurement, in which a broken line denotes results of the measurement on the reflectivity of light (LD light reflectivity), whereas a solid line denotes results of the measurement on the extraction efficiency of light.

It was confirmed from the measurement results that forming the cyclic structure, including the projections each having the substantially cone shape and that are arrayed at the pitch of the size that falls within the range in which the diffraction of the fluorescence emitted from the phosphor configuring the fluorescent member occurs, on the excitation light receiving surface and causing the aspect ratio of the cyclic structure to be 0.2 or greater make it possible to suppress the reflection of the excitation light at the surface of the wavelength conversion member and to output the fluorescence generated inside the wavelength conversion member to the outside at high efficiency.

The invention encompasses any possible combination of some or all of the various embodiments described herein and incorporated herein.

It is possible to achieve at least the following configurations from the above-described example embodiments of the invention.

(1) A fluorescence-emitting light source unit, including a wavelength conversion member having a light receiving surface and a phosphor, the light receiving surface being configured to receive excitation light, and the phosphor being configured to convert the excitation light received by the light receiving surface into fluorescence and emit the fluorescence, wherein the light receiving surface may include a cyclic structure having projections, the projections being cyclically arrayed and each having a substantially cone shape, an aspect ratio may be 0.2 or greater, the aspect ratio being a ratio of a height of any of the projections to a pitch of the array of the projections, and the pitch of the array is of a size that may fall within a range in which diffraction of the fluorescence emitted from the phosphor occurs.

(2) The fluorescence-emitting light source unit according to (1), wherein the wavelength conversion member may include a fluorescent member, the fluorescent member may contain the phosphor and having a surface that serves as the light receiving surface.

(3) The fluorescence-emitting light source unit according to (1), wherein the wavelength conversion member may include a fluorescent member and a cyclic structure layer, the fluorescent member may contain the phosphor, and the cyclic structure layer may be provided on the fluorescent member and may have a surface that serves as the light receiving surface.

(4) The fluorescence-emitting light source unit according to (3), wherein the cyclic structure layer may have a refractive index equal to or higher than a refractive index of the fluorescent member.

(5) The fluorescence-emitting light source unit according to any one of (1) to (4), wherein the wavelength conversion member may include a surface, a back surface, and a side surface, the surface may serve both as the light receiving surface and an output surface may be configured to output the fluorescence, and one or both of the back surface and the side surface may have a light reflecting function.

Although the invention has been described in terms of exemplary embodiments, it is not limited thereto. It should be appreciated that variations may be made in the described embodiments by persons skilled in the art without departing from the scope of the invention as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. Moreover, no element or component in this disclosure is intended to be dedicated to the public regardless of whether the element or component is explicitly recited in the following claims.

What is claimed is:

1. A fluorescence-emitting light source unit, comprising:
    a wavelength conversion member including a light receiving surface and a phosphor, the light receiving surface being configured to receive excitation light, and the phosphor being configured to convert the excitation light received by the light receiving surface into fluorescence and emit the fluorescence so that the light receiving surface serves as a fluorescence emitting surface; wherein
    the wavelength conversion member comprises a back surface opposite to the light receiving surface, a light reflection film is provided on the back surface;
    the light receiving surface includes a cyclic structure, the cyclic structure having projections, the projections being cyclically arrayed, each of the projections having a substantially cone shape;
    an aspect ratio is about 0.2 or greater and is about 0.8 or smaller, the aspect ratio being a ratio of a height of any of the projections to a pitch of the array of the projections;
    the height is about 500 nm or less; and
    the pitch of the array is of a size that falls within a range in which diffraction of the fluorescence emitted from the phosphor occurs.

2. The fluorescence-emitting light source unit according to claim 1, wherein the wavelength conversion member includes a fluorescent member, the fluorescent member containing the phosphor and including a surface that serves as the light receiving surface and the fluorescence emitting surface.

3. The fluorescence-emitting light source unit according to claim 1, wherein the wavelength conversion member includes a fluorescent member and a cyclic structure layer, the fluorescent member containing the phosphor, and the cyclic structure layer being provided on the fluorescent member and having a surface that serves as the light receiving surface and the fluorescence emitting surface.

4. The fluorescence-emitting light source unit according to claim 3, wherein the cyclic structure layer has a refractive index equal to or higher than a refractive index of the fluorescent member.

5. The fluorescence-emitting light source unit according to claim 1, wherein
    the wavelength conversion member includes a surface, a back surface, and a side surface,
    the surface serves both as the light receiving surface and the fluorescence emitting surface, and
    one or both of the back surface and the side surface has a light reflecting function.

6. The fluorescence-emitting light source unit according to claim 5, wherein
    a light reflection film is provided on one or both of the back surface and the side surface.

7. The fluorescence-emitting light source unit according to claim 6, wherein
    the light reflection film is made of silver.

8. A fluorescence-emitting light source unit, comprising:
    a wavelength conversion member including a light receiving surface and a phosphor, the light receiving surface being configured to receive excitation light, and the phosphor being configured to convert the excitation light received by the light receiving surface into fluorescence and emit the fluorescence so that the light receiving surface serves as a fluorescence emitting surface; wherein
    the wavelength conversion member comprises a back surface opposite to the light receiving surface, a light reflection film is provided on the back surface;
    the light receiving surface includes a cyclic structure, the cyclic structure having projections, the projections being cyclically arrayed, each of the projections having a substantially cone shape;
    the cyclic structure contains the phosphor; and
    the pitch of the array is of a size that falls within a range in which diffraction of the fluorescence emitted from the phosphor occurs.

9. The fluorescence-emitting light source unit according to claim 8, wherein the wavelength conversion member includes a fluorescent member, the fluorescent member containing the phosphor and including a surface that serves as the light receiving surface and the fluorescence emitting surface.

10. The fluorescence-emitting light source unit according to claim 8, wherein the wavelength conversion member includes a fluorescent member and a cyclic structure layer, the fluorescent member containing the phosphor, and the cyclic structure layer being provided on the fluorescent member and having a surface that serves as the light receiving surface and the fluorescence emitting surface.

11. The fluorescence-emitting light source unit according to claim 10, wherein the cyclic structure layer has a refractive index equal to or higher than a refractive index of the fluorescent member.

12. The fluorescence-emitting light source unit according to claim 8, wherein
    the wavelength conversion member includes a surface, a back surface, and a side surface,
    the surface serves both as the light receiving surface and the fluorescence emitting surface, and one or both of the back surface and the side surface has a light reflecting function.

13. The fluorescence-emitting light source unit according to claim 12, wherein
a light reflection film is provided on one or both of the back surface and the side surface.

14. The fluorescence-emitting light source unit according to claim 13, wherein
the light reflection film is made of silver.

15. The fluorescence-emitting light source unit according to claim 8, wherein
an aspect ratio is about 0.2 or greater, the aspect ratio being a ratio of a height of any of the projections to a pitch of the array of the projections.

16. The fluorescence-emitting light source unit according to claim 15, wherein
the aspect ratio is about 0.8 or smaller.

17. The fluorescence-emitting light source unit according to claim 16, wherein
the height is about 500 nm or less.

* * * * *